(12) United States Patent
Self

(10) Patent No.: US 6,409,520 B1
(45) Date of Patent: Jun. 25, 2002

(54) STRUCTURE AND METHOD FOR INTERCONNECTION OF PRINTED CIRCUIT BOARDS

(75) Inventor: Bobby J. Self, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/919,431

(22) Filed: Jul. 31, 2001

(51) Int. Cl.[7] ................................................ H01R 12/00
(52) U.S. Cl. ........................................................ 439/65
(58) Field of Search .............................. 439/65, 66, 83, 439/59, 108, 636

(56) References Cited

U.S. PATENT DOCUMENTS

| | | | | |
|---|---|---|---|---|
| 2,844,807 A | * | 7/1958 | McMulkin | 439/58 |
| 4,586,764 A | * | 5/1986 | Mullen, III et al. | 439/83 |
| 4,600,256 A | * | 7/1986 | Anttila | 439/65 |
| 4,785,533 A | * | 11/1988 | Seino et al. | 29/827 |
| 5,383,095 A | * | 1/1995 | Korsunsky et al. | 361/785 |
| 5,411,420 A | * | 5/1995 | Dennis | 439/876 |
| 5,514,907 A | * | 5/1996 | Moshayedi | 257/723 |

* cited by examiner

*Primary Examiner*—Tulsidas Patel
(74) *Attorney, Agent, or Firm*—Kyle J. Way

(57) ABSTRACT

An electrical connection structure and method allow the coupling of one printed circuit board with another without the use of cables or connectors. An edge of one printed circuit board contains a plurality of plated split holes. Within each hole, an electrically conductive leg is maintained by way of solder, thus providing electrical connectivity between the first and second printed circuit boards. Additionally, a method of soldering a wire coil into a series of such edge-positioned plated split holes and subsequently cutting the coil along the edge of the first printed circuit board will yield the desired conductive legs.

10 Claims, 3 Drawing Sheets

STRUCTURE AND METHOD FOR INTERCONNECTION OF PRINTED CIRCUIT BOARDS

BACKGROUND OF THE INVENTION

With electronic signal switching speeds currently in the gigahertz range and still increasing, deleterious transmission line effects have become more prevalent. For example, the electrical connection of two printed circuit boards (PCBs) in an electronic system, normally accomplished by way of wire cables and connectors, or by way of standard board-edge connectors, often results in relatively long transmission lines between the two boards, allowing unwanted signal reflections to exist. To mitigate these effects, shorter transmission lines between electronic components in an electronic system are advantageous.

To that end, direct connection between two PCBs in the absence of a standard connector is desirable, as the transmission line lengths for such a connection scheme are reduced to a minimum. The most direct connection between two PCBs involves soldering the edge of one PCB to the side of the second PCB. Unfortunately, such a configuration is typically mechanically unstable, making the process of soldering the first PCB to the second difficult.

Thus, the use of some kind of PCB interconnection structure or method that minimizes signal line lengths between two PCBs while allowing the relative position of the two PCBs to remain stable during the soldering process would be advantageous.

SUMMARY OF THE INVENTION

Specific embodiments according to the present invention, to be described herein, provide an effective structure for electrically coupling an edge of a first PCB to a side of a second PCB. The first PCB has a plurality of plated split holes incorporated on the edge of the first PCB that is to be attached to the second PCB. An electrically conductive leg is held within each of the plated split holes. In effect, the legs serve as solderable leads for the first PCB. The legs help keep the first PCB steady while the leads are soldered to the second PCB. The legs also provide the short electrical connections required of high-speed electronic signals being transmitted between the first and second PCBs.

Embodiments of the present invention also involve a method of producing a structure for electrically coupling an edge of a first PCB to a side of a second PCB. During the design of the first PCB, a plurality of plated split holes are incorporated along the edge of the first PCB that is to be coupled with the second PCB, with the plated split holes being spaced at a substantially consistent distance along the edge. Next, a coil of electrically conductive wire is placed along the edge of the first PCB, with each successive turn of the coil of wire being placed within each successive plated split hole. The distance between each turn of the coil is approximately the same as the distance between adjacent plated split holes. The coil of wire is then cut on both sides along the edge of the first PCB, leaving an electrically conductive leg soldered to each plated hole. Additionally, connection structures made according to the disclosed method embodiments are also embodiments of the present invention.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENT

Figure 1:
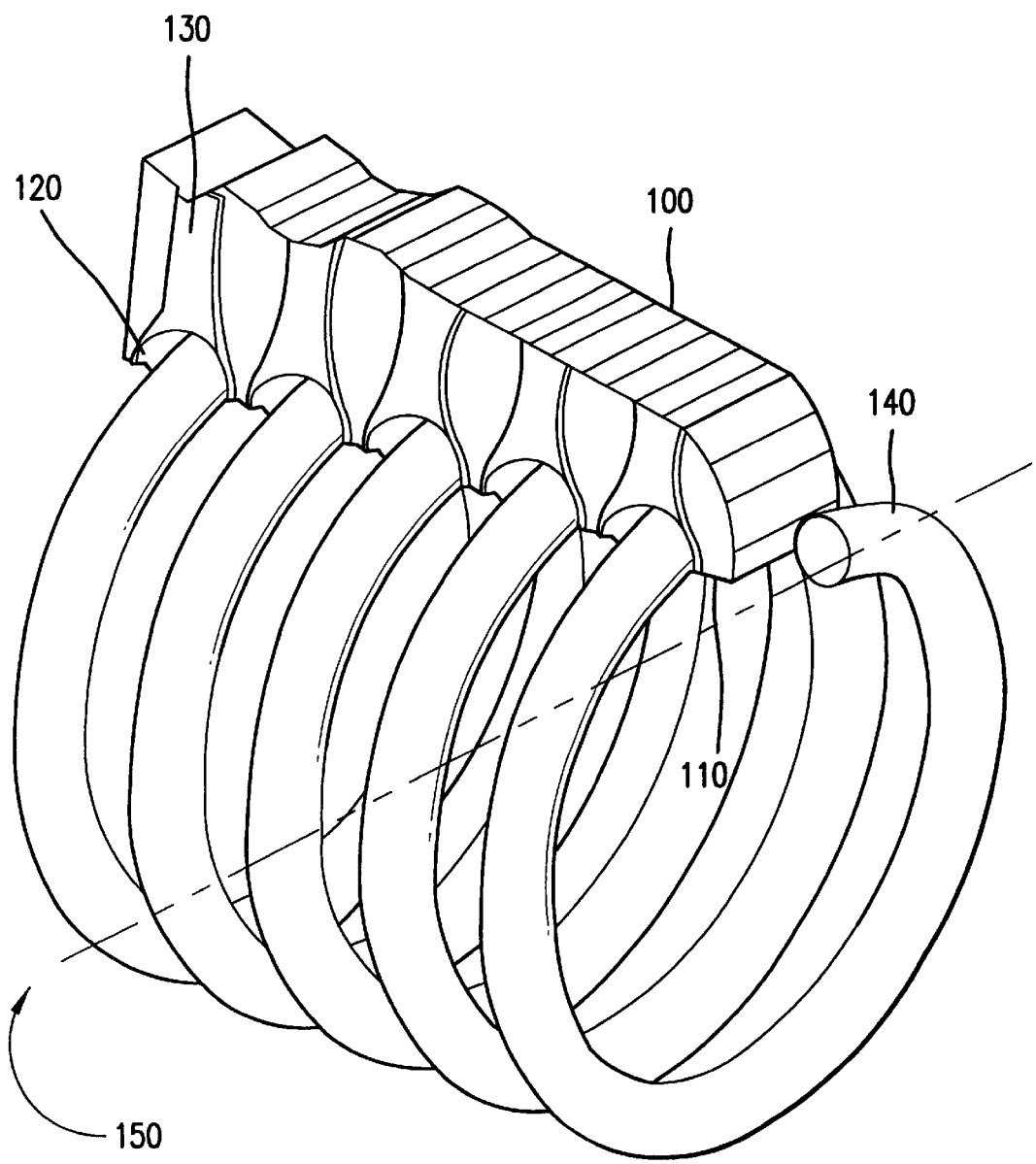
FIG. 1 is a perspective view of a coil of electrically conductive wire immediately before being soldered to plated split holes of a first PCB, according to an embodiment of the invention.

FIG. 1 depicts partial development of an embodiment of the invention. An edge 110 of a first PCB 100 is to be attached to the side of a second printed circuit board (not shown). Incorporated along edge 110 are plated split holes 120. In other words, split holes 120 are essentially plated-through "half" holes that reside on edge 110, as opposed to complete plated-through holes that normally reside on the interior of a board. The plating of each split hole 120 is connected to a board trace 130, which is, in turn, electrically coupled to one or more electronic components (not shown). Split holes 120 are located along edge 110 of first PCB 100 at a substantially consistent interhole distance. That distance would be any spacing normally associated with the lead spacing of a typical leaded surface mount device, including, but not limited to, distances of 100 mils, 50 mils, 20 mils, and so on.

A coil of electrically conductive wire 140 is placed alongside edge 110 of first PCB 100 so that each turn of coil 140 is inserted inside one of plated split holes 120. In the embodiment of FIG. 1, coil 140 has a circular shape when viewed along its length. Other shapes, including, but not limited to, squares, rectangles, and ovals, could also be used. Furthermore, in some embodiments, coil 140 is manufactured from gold-plated brass. Brass holds its shape well under high-temperature soldering conditions, while the gold plating lends solderability to coil 140. However, other solderable materials may also be employed for coil 140. As can be seen in FIG. 1, the distance between each adjacent turn of coil 140 substantially matches the distance between adjacent split holes 120. Coil 140 is typically about 5 mils to 8 mils thick, although any thickness that allows each turn of coil 140 to reside within split holes 120 could be utilized. Each turn of coil 140 is then soldered into each associated split hole 120. After coil 140 has been soldered in place, each turn of coil 140 is cut along cutting line 150 on both sides of edge 110 for the length of the coil. Such cutting may be accomplished by use of a cutting laser, a blanking die, or wire electrical discharge machining (wire EDM) process. Other available cutting or machining processes known in the art may also be employed.

Figure 2:
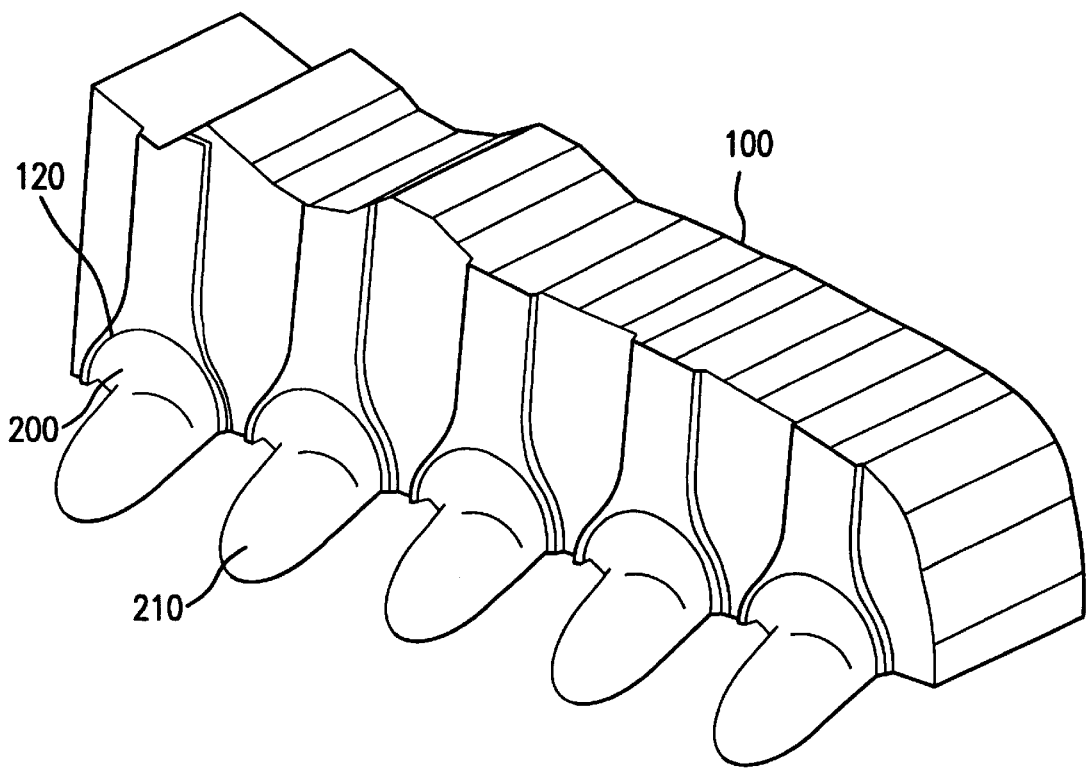
FIG. 2 is a perspective view of the wire coil after it has been soldered within the plated split holes and cut to yield conductive legs that may then be soldered to the side of a second PCB, according to an embodiment of the invention.

The resulting assembly after coil 140 has been soldered and cut is shown in FIG. 2. Electrically conductive legs 210, held within plated split holes 120 by solder 200, are the portions of coil 140 remaining after the cutting of coil 140 has occurred. Due to the circular shape of coil 140 in this embodiment, each of legs 210 acquires the shape of an arc. The placement of cutting line 150 (of FIG. 1) is not critical, as long as legs 210 are of such a length as to allow first PCB 100 to stand essentially upright on legs 210 so that first PCB 100 may be positioned on a side of the second PCB (not shown) while the second PCB is horizontally oriented. Legs 210 allow first PCB 100 to remain stationary while legs 210 are soldered to the second PCB, completing the connection between first PCB 100 and the second board. This feature is particularly advantageous for applications in which the first PCB is to be hand-soldered to a board after the second PCB has already had other components soldered to its surface. One example of such an application is when the first PCB carries test equipment probes that are to be soldered to the second PCB prior to the testing and data acquisition of signals of the second PCB.

Some embodiments employ a high-temperature solder for solder 200 that holds electrically conductive legs 210 within plated split holes 120, when compared to the solder utilized to solder legs 210 to the second PCB. The use of high-temperature solder allows legs 210 to securely maintain their connection with first PCB 100 while they are being soldered to the second PCB using a lower-temperature solder.

Figure 3:
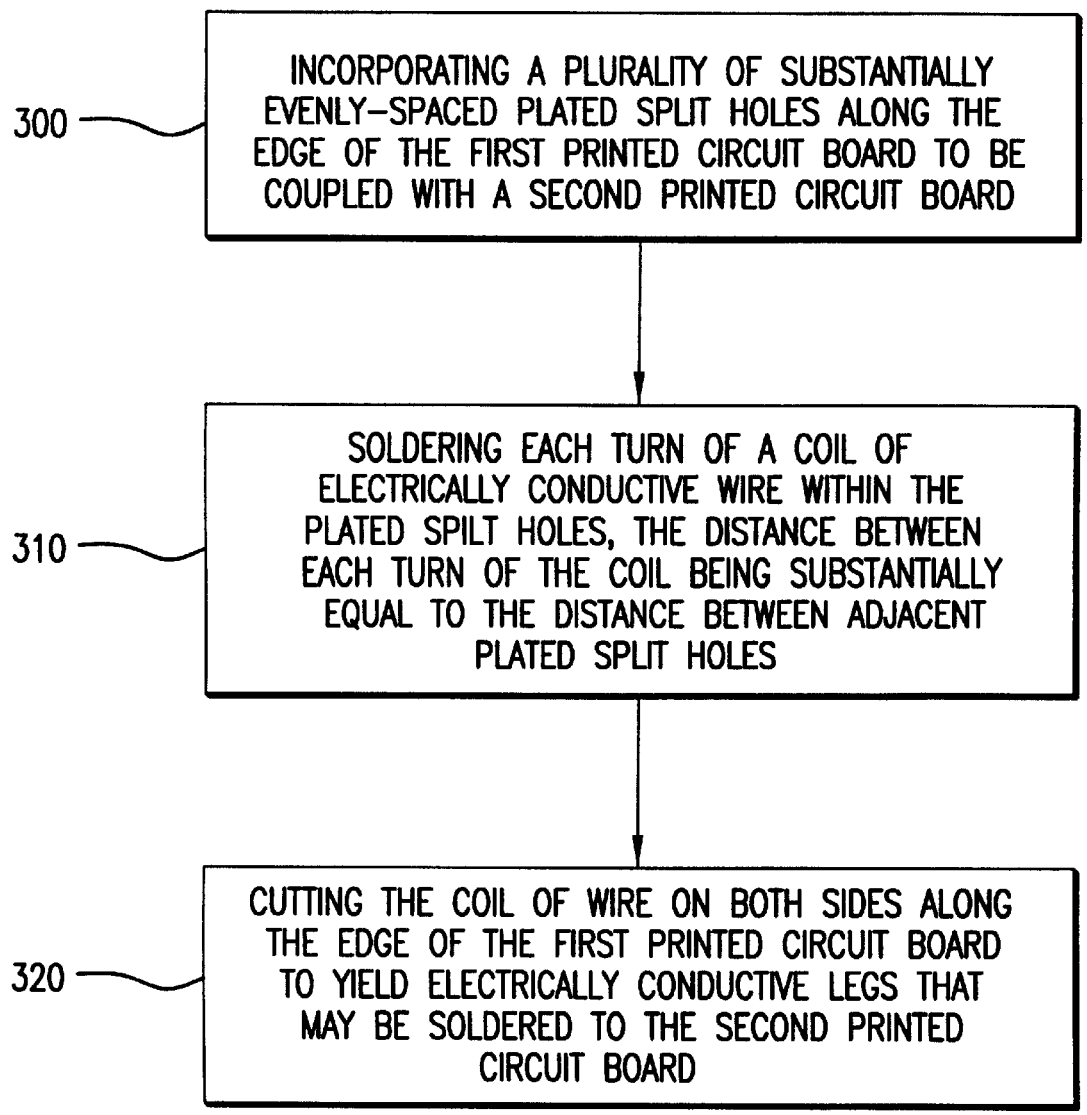
FIG. 3 is a flow chart of a method of attaching electrically conductive legs to a first PCB for connection with a second PCB, according to an embodiment of the invention.

The methods described above also constitute embodiments of the present invention. As shown in the flow chart of FIG. 3, substantially evenly-spaced plated split holes are incorporated along an edge of a first PCB (step 300). Each turn of a coil of electrically conductive wire is then soldered within each corresponding plated split hole (step 310). The distance between each successive turn of the coil is substantially the same as the distance between adjacent split holes. The coil is then cut on both sides of the first PCB along the edge of the first PCB, yielding electrically conductive legs that may then be soldered to a second printed circuit board (step 320).

Other structural equivalents of electrically conductive legs 210 that allow first PCB 100 to remain in an upright position while legs 210 are subsequently soldered to a second PCB, even though not fashioned according to the method described above, are also embodiments of the present invention.

What is claimed is:

1. A structure for electrically coupling an edge of a first printed circuit board to a side of a second printed circuit board in a substantially perpendicular orientation, the structure comprising:

a plurality of electrically conductive legs, with each leg being soldered within a corresponding plated split hole defined by the edge of the first printed circuit board, each leg having an end extending from each side of the edge of the first printed circuit board, both ends of each leg thus capable of making contact with and being soldered to the side of the second printed circuit board to provide electrical connectivity between the first and second printed circuit boards.

2. The structure of claim 1, wherein the electrically conductive legs are gold-plated brass.

3. The structure of claim 1, wherein the electrically conductive legs are fashioned in the shape of an arc.

4. A method of producing a structure for electrically coupling an edge of a first printed circuit board to a side of a second printed circuit board in a substantially perpendicular orientation, the method comprising the steps of:

incorporating a plurality of plated split holes along the edge of the first printed circuit board that is to be coupled with the second printed circuit board, with the plated split holes being spaced at a substantially consistent distance therebetween;

soldering each turn of a coil of electrically conductive wire into one of the plated split holes, with successive turns of the coil of wire having a distance therebetween substantially equivalent to the distance between the plated split holes; and cutting the coil of wire along both sides of the first printed circuit board along the edge of the first printed circuit board, thereby yielding electrically conductive legs that are soldered to each plated split hole.

5. The method of claim 4, wherein each turn of the coil of wire is essentially circular in shape.

6. The method of claim 4, wherein the coil of wire is gold-plated brass.

7. The method of claim 4, wherein the cutting step is performed using a blanking die.

8. The method of claim 4, wherein the cutting step is performed using a laser.

9. The method of claim 4, wherein the cutting step is performed using a wire electrical discharge machining process.

10. A structure for electrically coupling an edge of a first printed circuit board to a side of a second printed circuit board in a substantially perpendicular orientation, produced according to the method of claim 4.

* * * * *